(12) United States Patent
Zhang et al.

(10) Patent No.: US 12,160,028 B2
(45) Date of Patent: Dec. 3, 2024

(54) HIGH-BANDWIDTH ANTENNA IN PACKAGE APPARATUS

(71) Applicant: HUAWEI TECHNOLOGIES CO., LTD., Guangdong (CN)

(72) Inventors: Haiwei Zhang, Dongguan (CN); Haotao Hu, Shenzhen (CN); Yaojiang Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/435,613

(22) Filed: Feb. 7, 2024

(65) Prior Publication Data

US 2024/0178547 A1 May 30, 2024

Related U.S. Application Data

(63) Continuation of application No. 17/234,920, filed on Apr. 20, 2021, now Pat. No. 11,929,543, which is a continuation of application No. PCT/CN2018/112186, filed on Oct. 26, 2018.

(51) Int. Cl.
H01Q 1/48 (2006.01)
H01Q 1/22 (2006.01)
H01Q 19/30 (2006.01)
H01Q 21/06 (2006.01)

(52) U.S. Cl.
CPC .............. *H01Q 1/2283* (2013.01); *H01Q 1/48* (2013.01); *H01Q 19/30* (2013.01); *H01Q 21/067* (2013.01)

(58) Field of Classification Search
CPC ........ H01Q 1/2283; H01Q 1/48; H01Q 19/30; H01Q 21/067
See application file for complete search history.

(56) References Cited

U.S. PATENT DOCUMENTS 9,666,954 B2 5/2017 Ko et al.
9,667,290 B2 5/2017 Ouyang et al.
9,711,866 B1 7/2017 Doane et al.
9,819,098 B2 11/2017 Gu et al.
(Continued)

FOREIGN PATENT DOCUMENTS

CN 1627562 A 6/2005
CN 103779336 A 5/2014
(Continued)

OTHER PUBLICATIONS

El-Halwagy et al., "Investigation of Wideband Substrate-Integrated Vertically-Polarized Electric Dipole Antenna and Arrays for mm-Wave 5G Mobile Devices," IEEE Access, Dec. 2017, 13 pages.
(Continued)

Primary Examiner — Graham P Smith
(74) Attorney, Agent, or Firm — Fish & Richardson P.C.

(57) ABSTRACT

This disclosure discloses implementations for high-bandwidth antenna in package (AiP) apparatuses. In an example, an AiP apparatus comprises: a first radiator, a second radiator, a first substrate, a second substrate, a first metal piece, and a first feeding path. The first radiator and the first feeding path are disposed on the first substrate, the second radiator is disposed on the second substrate, the first feeding path is configured to feed the first radiator, and the second radiator and the first radiator are connected using the first metal piece disposed between the first substrate and the second substrate.

20 Claims, 12 Drawing Sheets

(56) References Cited

U.S. PATENT DOCUMENTS

| | | | |
|---|---|---|---|
| 9,912,071 | B2 | 3/2018 | Diukman et al. |
| 9,972,919 | B2 | 5/2018 | Hong et al. |
| 2016/0056544 | A1 | 2/2016 | Garcia et al. |
| 2016/0336646 | A1 | 11/2016 | Baek et al. |
| 2017/0237154 | A1 | 8/2017 | Choudhury et al. |
| 2018/0131094 | A1 | 5/2018 | Ho et al. |

FOREIGN PATENT DOCUMENTS

| | | |
|---|---|---|
| CN | 107196059 A | 9/2017 |
| CN | 107646156 A | 1/2018 |
| JP | 2000341026 A | 12/2000 |
| WO | 2016021935 A1 | 2/2016 |
| WO | 2016064212 A1 | 4/2016 |

OTHER PUBLICATIONS

Extended European Search Report issued in European Application No. 18937809.4 on Jul. 20, 2021, 9 pages.

Hsu et al., "Dual-Polarized Quasi Yagi-Uda Antennas With Endfire Radiation for Millimeter-Wave MIMO Terminals," IEEE Transactions on Antennas and Propagation, vol. 65, No. 12, Dec. 2017, 8 pages.

Jo et al., "Exploitation of Dual-Polarization Diversity for 5G Millimeter-Wave MIMO Beamforming Systems," IEEE Transactions on Antennas and Propagation, vol. 65, No. 12, Dec. 2017, 10 pages.

Kuo et al., "A Fully SiP Integrated-Band Butler Matrix End-Fire Beam-Switching Transmitter Using Flip-Chip Assembled CMOS Chips on LTCC," IEEE Transactions on Microwave Theory and Techniques, vol. 60, No. 5, May 2012, 13 pages.

Li et al., "A Multibeam End-Fire Magnetoelectric Dipole Antenna Array for Millimeter-Wave Applications," IEEE Transactions on Antennas and Propagation, vol. 64, No. 7, Jul. 2016, 11 pages.

Office Action issued in Chinese Application No. 201880092395.9 on Jun. 3, 2021, 7 pages.

PCT International Search Report and Written Opinion issued in International Application No. PCT/CN2018/112186 on Jul. 25, 2019, 15 pages (with English translation).

Suga et al., "Cost-Effective 60-GHz Antenna Package With End-Fire Radiation for Wireless File-Transfer System," IEEE Transactions on Microwave Theory and Techniques, vol. 58, No. 12, Dec. 2010, 7 pages.

HIGH-BANDWIDTH ANTENNA IN PACKAGE APPARATUS

CROSS-REFERENCE TO RELATED APPLICATION

This application is a continuation of U.S. patent application Ser. No. 17/234,920, filed on Apr. 20, 2021, which is a continuation of International Application No. PCT/CN2018/112186, filed on Oct. 26, 2018. All of the afore-mentioned patent applications are hereby incorporated by reference in their entireties.

TECHNICAL FIELD

This application relates to the field of semiconductors, and in particular, to the field of antennas in package.

BACKGROUND

With the advent of the 5G (5th-Generation) communications era, millimeter wave transmission has become an important choice for global operators. In millimeter-wave transmission, as a terminal transceiver component, a millimeter-wave antenna plays an important role. As a communication signal frequency increases, a loss of a signal on a transmission line also significantly increases, thereby affecting communication quality. An Antenna in Package (AiP) can better solve a problem that a loss of a signal on a transmission line is relatively large. The AiP integrates an antenna and a chip and packages the antenna and the chip in a package structure, thereby reducing a transmission loss between the antenna and the chip, and improving system integration.

When a 5G millimeter-wave terminal device communicates with a base station, a data center, or the like, due to particularity of a posture of a handheld device, an antenna in the terminal device needs to have an end-fire radiation function in addition to a broadside radiation function. In addition, to improve communication quality, a dual-polarized transceiver antenna is generally used to perform polarization diversity receiving, or Multiple-Input Multiple-Output (MIMO) communication is established by using two polarization directions of a dual-polarized antenna. FIG. 1 shows an antenna in package 100 in the prior art, including broadside antennas 110 and end-fire antennas 120, where a chip (die) 130 is reversely mounted at the bottom of the antenna in package 100, and feeds the broadside antenna 110 and the end-fire antenna 120 through feeding paths 140, to complete dual polarization respectively. Because a miniaturization trend of the terminal device imposes an increasingly strict limitation on a thickness of the antenna in package, it is difficult to implement vertical polarization of the end-fire antenna 120. For example, the thickness of the antenna in package in the terminal device is limited to about 0.9 mm, and a physical size required by the end-fire antenna 120 to work normally is about a half wavelength of a resonance frequency (for example, a half wavelength of a millimeter wave at 28 GHz frequency band is about 5 mm). Therefore, it is difficult to implement vertical polarization of the end-fire antenna 120 when the thickness of the antenna in package is limited. In the prior art, when the thickness of the antenna in package is relatively small, vertical polarization of the end-fire antenna 120 may be implemented by bending the end-fire antenna 120. However, the foregoing bending processing shortens an effective current path for the vertical polarization of the end-fire antenna 120. Therefore, a bandwidth of the antenna is limited, and a bandwidth requirement of a 5G millimeter wave at 28 GHz frequency band cannot be met.

SUMMARY

Embodiments of this application provide an antenna in package apparatus, to resolve a problem that a vertical polarization current path of an end-fire antenna in a terminal device is relatively short and a bandwidth of the end-fire antenna is relatively low.

According to a first aspect, an embodiment of this application provides an antenna in package apparatus, including a first radiator, a second radiator, a first feeding path, a first metal piece, and a first substrate and a second substrate that are disposed opposite to each other. The first radiator and the first feeding path are disposed in the first substrate. The second radiator is disposed in the second substrate. The first feeding path is configured to feed the first radiator. The two radiators are connected by using the first metal piece disposed between the two substrates.

Because the first metal piece connects the two radiators, an increased equivalent height of an antenna is equal to sum of a height of the first metal piece and a height of the second radiator, such that a vertical polarization current path generated by the antenna may be distributed not only on the first radiator, but also on the first metal piece and the second radiator. Therefore, the vertical polarization current path is increased, thereby increasing a gain and a bandwidth of the antenna in the antenna in package apparatus.

In a possible implementation, the antenna in package apparatus further includes a second feeding path disposed in the second substrate, and a second metal piece configured to connect the two feeding paths in the two substrates. The second feeding path is configured to feed the second radiator. Because the second metal piece is connected to the two feeding paths, equivalent heights of the feeding paths are also increased. Therefore, the vertical polarization current path in the feeding paths is increased, which is more conducive to feeding the two radiators, thereby increasing the gain and the bandwidth of the antenna.

In a possible implementation, the first radiator includes a first ground plate, the second radiator includes a second ground plate, and the two ground plates are connected by using the first metal piece. The two ground plates are connected, such that the vertical polarization current path on the ground plates is increased, and backward radiation of the antenna is reduced, thereby increasing the gain of the antenna.

In a possible implementation, the first radiator includes a first main radiation plate, the second radiator includes a second main radiation plate, and the two main radiation plates are connected by using the first metal piece. The two main radiation plates are connected, such that the vertical polarization current path on the main radiation plates is increased, thereby increasing the bandwidth and the gain of the antenna.

In a possible implementation, the first radiator includes a first parasitic radiator, the second radiator includes a second parasitic radiator, and the two parasitic radiators are connected by using the first metal piece. The two parasitic radiators are connected, such that the vertical polarization current path on the parasitic radiators is increased, thereby increasing directivity of the antenna.

In a possible implementation, the first main radiation plate and the second main radiation plate include ±45° polarized dual-polarized elements. The first main radiation plate includes a first positive-polarized element and a first negative-polarized element between which an included angle is 90°, and the second main radiation plate includes a second positive-polarized element and a second negative-polarized element between which an included angle is 90°. A ±45° dual-polarized antenna can be implemented by adjusting directions of the two main radiation plates, such that a polarization manner of the antenna in the antenna in package apparatus is more flexible.

In a possible implementation, the first radiator includes a first main radiation plate, the second radiator includes a second main radiation plate, the two main radiation plates are not directly connected, the first feeding path is configured to perform coupling feeding on the first main radiation plate, and the second feeding path is configured to perform coupling feeding on the second main radiation plate. Coupling is performed in a coupling feeding manner, such that a feeding manner is more flexible when the vertical polarization current path on the two main radiation plates is increased.

In a possible implementation, the antenna in package apparatus further includes a first chip, the first chip is disposed on a side that is of the first substrate and that faces the second substrate, and the first chip is configured to provide a radio frequency signal for the two feeding paths. The antenna in package apparatus integrates and package the chip and the antenna together, such that a loss of the radio frequency signal on a transmission line is reduced, thereby improving communication quality.

In a possible implementation, maximum radiation directions of the first radiator and the second radiator are perpendicular to a normal line of the first chip. That is, the two radiators are end-fire antennas in the antenna in package apparatus. Equivalent heights of the end-fire antennas are increased, such that the vertical polarization current path is increased, thereby increasing the gain and the bandwidth of the antenna.

In a possible implementation, the antenna in package apparatus further includes a third radiator parallel to the normal line of the first chip. That is, the third radiator is a broadside antenna in the antenna in package apparatus. The broadside antenna and improved end-fire antennas are integrated in a same antenna in package, which helps to improve overall gain and bandwidth of the antenna.

In a possible implementation, the first metal piece and the second metal piece are ball grid array BGA balls. The BGA balls are used as materials of the metal pieces, such that costs are relatively low and a distance between the two substrates can be well controlled.

In a possible implementation, at least one of the first radiator, the second radiator, the first feeding path, or the second feeding path is implemented by using a via. The foregoing structure is implemented by using the via, such that process complexity can be reduced.

In a possible implementation, at least one of the first radiator, the second radiator, the first feeding path, or the second feeding path is implemented by using via arrays arranged in a staggered manner and a cable, and the cable is used to connect the via arrays in a horizontal direction. The foregoing structure is implemented by using the via arrays and the cable, such that directions and structures of the antenna and the feeding paths are more flexible. For example, ±45° polarization can be implemented, or a via layout and cabling are performed according to an actual requirement for antenna array arrangement.

In a possible implementation, the second radiator is disposed on a side that is of the second substrate and that faces the first substrate, and the second radiator includes a solder pad or a cable. When there is a relatively small requirement for the height of the antenna, the vertical polarization current path may be increased only by using the second metal piece and the solder pad or the cable on the surface of the second substrate, and an antenna structure does not need to be disposed inside the second substrate. In this case, an increment of the vertical polarization current path is the height of the second metal piece. By using the foregoing structure, the structure of the antenna in package apparatus can be simplified, and costs can be reduced.

In a possible implementation, the antenna in package apparatus further includes a second chip, and the second chip is disposed on a side that is of the second substrate and that is distant from the first substrate. The second chip may be a data processing chip, for example, a Central Processing Unit (CPU), or a data cache chip, for example, a Dynamic Random Access Memory (DRAM). The second chip, the first chip, and antennas are integrated into the antenna in package apparatus, such that functions of the antenna in package apparatus can be more complete, and a data processing capability can be stronger.

In a possible implementation, the first substrate is an interposer. The interposer is used as a material of the first substrate, such that the structure of the antenna in package apparatus is more stable.

In a possible implementation, the second substrate is a first printed circuit board PCB. For example, the second substrate is a high-frequency PCB, and another chip or circuit may be further disposed on the high-frequency PCB, such that the antenna in package apparatus has another data processing or transmission function.

In a possible implementation, the first main radiation plate is connected to the first ground plate, the second main radiation plate is connected to the second ground plate, and the first ground plate is connected to the second ground plate by using the first metal piece. The first feeding path and the second feeding path are disposed in the first substrate and the second substrate respectively, and are connected by using the second metal piece, to perform coupling feeding on the first main radiation plate and the second main radiation plate. The two feeding paths may be disposed inside the two substrates, or may be disposed on two opposite surfaces of the two substrates. Coupling is performed in a coupling feeding manner, such that the antennas in the antenna in package apparatus are more flexibly designed.

In a possible implementation, the antenna in package apparatus includes a Vivaldi antenna, where the first ground plate, the second ground plate, the first main radiation plate, and the second main radiation plate, the first feeding path, and the second feeding path are implemented by using an interlayer cable and a via or a via array. An implementation for a plurality of types of antennas may be formed by adjusting the interlayer cable and a layout of the via or the via array, such that antenna types of the antenna in package apparatus are more flexibly designed.

In a possible implementation, the antenna in package apparatus includes a monopole antenna. Bending processing is performed on the second main radiation plate, such that a low-frequency working requirement of the antenna can be met, and the antenna types of the antenna in package apparatus are more flexibly designed.

In a possible implementation, the antenna in package apparatus includes a Yagi antenna, where the first feeding path is configured to feed the first main radiation plate, and the second feeding path is configured to short-circuit the second main radiation plate and the second ground plate. A feeding manner of the foregoing two feeding paths is changed, such that the antenna types of the antenna in package apparatus are more flexibly designed.

According to a second aspect, an embodiment of this application provides a terminal device. The terminal device includes the antenna in package apparatus according to the first aspect and the possible implementations of the first aspect.

Because the first metal piece connects the two radiators, the increased equivalent height of the antenna is equal to the sum of the height of the first metal piece and the height of the second radiator, such that the vertical polarization current path generated by the antenna may be distributed not only on the first radiator, but also on the first metal piece and the second radiator. Therefore, the vertical polarization current path is increased, thereby increasing the gain and the bandwidth of the antenna in the terminal device.

In a possible implementation, the terminal device further includes a third radiator, a first mechanical part, and a third metal piece. The first mechanical part is disposed on a side that is of the second substrate and that is distant from the first substrate. The third radiator is disposed in the first mechanical part, and is connected to the second radiator by using the third metal piece. The first feeding path is further configured to feed the third radiator. The antenna is extended into a mechanical part outside the antenna in package apparatus, to fully use limited space of the terminal device. This helps further increase the equivalent height of the antenna and increase the vertical polarization current path, thereby improving the gain and the bandwidth of the antenna in the terminal device.

In a possible implementation, the terminal device further includes a fourth radiator, a second mechanical part, and a fourth metal piece. The second mechanical part is disposed on a side that is of the first substrate and that is distant from the second substrate. The fourth radiator is disposed in the second mechanical part, and is connected to the first radiator by using the third metal piece. The first feeding path is further configured to feed the fourth radiator. The antenna is extended into the mechanical part outside the antenna in package apparatus, to fully use the limited space of the terminal device. This helps further increase the equivalent height of the antenna and increase the vertical polarization current path, thereby improving the gain and the bandwidth of the antenna in the terminal device.

In a possible implementation, the terminal device further includes a fifth radiator, a second PCB, and a fifth metal piece. The second PCB is disposed on a side that is of the second substrate and that is distant from the first substrate. The fifth radiator is disposed in the second PCB, and is connected to the second radiator by using the fifth metal piece. The first feeding path is further configured to feed the fifth radiator. The antenna is extended into another PCB, such that the terminal device fully uses the limited space of the terminal device when the terminal device includes a plurality of PCBs disposed in a stacked manner. This helps further increase the equivalent height of the antenna and increase the vertical polarization current path, thereby improving the gain and the bandwidth of the antenna in the terminal device.

In a possible implementation, the third metal piece, the fourth metal piece, and the fifth metal piece are metal lapping lines. The metal lapping lines are used to connect the radiators, such that a vertical polarization current can be better distributed between the radiators, thereby improving the gain and the bandwidth of the antenna in the device.

In a possible implementation, at least one of the third radiator, the fourth radiator, or the fifth radiator includes a metal column and a metal-plated cable. By disposing the metal column and the metal-plated cable on surfaces of or inside a mechanical part and a PCB, the structure of the radiator can be implemented at relatively low costs.

According to a third aspect, an embodiment of this application provides an antenna in package apparatus, including a first radiator, a first feeding path, a first metal piece, and a first substrate. The first radiator and the first feeding path are disposed in the first substrate. The first metal piece is configured to connect the first radiator in the first substrate to a second radiator in a second substrate. The first feeding path is configured to feed the first radiator.

Because the first metal piece connects the two radiators, an increased equivalent height of an antenna is equal to sum of a height of the first metal piece and a height of the second radiator, such that a vertical polarization current path generated by the antenna may be distributed not only on the first radiator, but also on the first metal piece and the second radiator. Therefore, the vertical polarization current path is increased, thereby increasing a gain and a bandwidth of the antenna in the antenna in package apparatus.

In a possible implementation, the antenna in package apparatus further includes a second metal piece. The second metal piece is configured to connect the first feeding path and a second feeding path that is in the second substrate. The second feeding path is configured to feed the second radiator. Because the second metal piece is connected to the two feeding paths, equivalent heights of the feeding paths are also increased. Therefore, the vertical polarization current path in the feeding paths is increased, which is more conducive to feeding the two radiators, thereby increasing the gain and the bandwidth of the antenna.

In a possible implementation, the first radiator includes a first ground plate, the second radiator includes a second ground plate, and the two ground plates are connected by using the first metal piece. The two ground plates are connected, such that the vertical polarization current path on the ground plates is increased, and backward radiation of the antenna is reduced, thereby increasing the gain of the antenna.

In a possible implementation, the first radiator includes a first main radiation plate, the second radiator includes a second main radiation plate, and the two main radiation plates are connected by using the first metal piece. The two main radiation plates are connected, such that the vertical polarization current path on the main radiation plates is increased, thereby increasing the bandwidth and the gain of the antenna.

In a possible implementation, the first radiator includes a first parasitic radiator, the second radiator includes a second parasitic radiator, and the two parasitic radiators are connected by using the first metal piece. The two parasitic radiators are connected, such that the vertical polarization current path on the parasitic radiators is increased, thereby increasing directivity of the antenna.

In a possible implementation, the first main radiation plate and the second main radiation plate may include ±45° polarized dual-polarized elements. The first main radiation plate includes a first positive-polarized element and a first negative-polarized element between which an included angle is 90°, and the second main radiation plate includes a second positive-polarized element and a second negative-polarized element between which an included angle is 90°. A ±45° dual-polarized antenna can be implemented by adjusting directions of the two main radiation plates, such that a polarization manner of an antenna in the antenna in package apparatus is more flexible.

In a possible implementation, the antenna in package apparatus further includes a first chip, the first chip is disposed on a side that is of the first substrate and that faces the second substrate, and the first chip is configured to provide a radio frequency signal for the two feeding paths. The antenna in package apparatus integrates and package the chip and the antenna together, such that a loss of the radio frequency signal on a transmission line is reduced, thereby improving communication quality.

In a possible implementation, maximum radiation directions of the first radiator and the second radiator are perpendicular to a normal line of the first chip. That is, the two radiators are end-fire antennas in the antenna in package apparatus. Equivalent heights of the end-fire antennas are increased, such that the vertical polarization current path is increased, thereby increasing the gain and the bandwidth of the antenna.

In a possible implementation, the first metal piece and the second metal piece are ball grid array BGA balls. The BGA balls are used as materials of the metal pieces, such that costs are relatively low and a distance between the two substrates can be well controlled.

In a possible implementation, the antenna in package apparatus further includes a third radiator parallel to the normal line of the first chip. That is, the third radiator is a broadside antenna in the antenna in package apparatus. The broadside antenna and improved end-fire antennas are integrated in a same antenna in package, which helps to improve overall gain and bandwidth of the antenna.

In a possible implementation, at least one of the first radiator and the first feeding path is implemented by using a via. The foregoing structure is implemented by using the via, such that process complexity can be reduced.

In a possible implementation, at least one of the first radiator and the first feeding path is implemented by using via arrays arranged in a staggered manner and a cable, and the cable is used to connect the via arrays in a horizontal direction. The foregoing structure is implemented by using the via arrays and the cable, such that directions and structures of the antenna and the feeding paths are more flexible. For example, ±45° polarization can be implemented, or a via layout and cabling are performed according to an actual requirement for antenna array arrangement.

According to a fourth aspect, an embodiment of this application provides a terminal device, including a rear cover, a side frame, a display apparatus, a middle frame, and an antenna in package apparatus. The display apparatus, the middle frame, and the antenna in package apparatus are sequentially disposed in a stacked manner. The rear cover is disposed on a side that is of the antenna in package apparatus and that is distant from the middle frame. The middle frame and the display apparatus are connected to one end of the side frame, and the other end of the side frame is connected to the rear cover. The antenna in package apparatus is the antenna in package apparatus according to the first aspect and the possible implementations of the first aspect.

Because the first metal piece connects the two radiators, the increased equivalent height of the antenna is equal to the sum of the height of the first metal piece and the height of the second radiator, such that the vertical polarization current path generated by the antenna may be distributed not only on the first radiator, but also on the first metal piece and the second radiator. Therefore, the vertical polarization current path is increased, thereby increasing the gain and the bandwidth of the antenna in the terminal device.

In a possible implementation, the terminal device further includes a second PCB disposed between the middle frame and the antenna in package apparatus. A plurality of PCBs are disposed in the terminal device, and other chips or circuits may be further disposed on the PCBs, such that the terminal device has other data processing or transmission functions.

In a possible implementation, the terminal device further includes a first shielding frame disposed between the antenna in package apparatus and the second PCB, and the first shielding frame is configured to shield and interfere with an electromagnetic wave between the second PCB and the second substrate. The first shielding frame can reduce impact of electromagnetic waves in the second PCB and the second substrate on other circuits.

In a possible implementation, the terminal device further includes a second shielding frame disposed between the second PCB and the middle frame, and the second shielding frame is configured to shield and interfere with an electromagnetic wave between the second PCB and the middle frame. The second shielding frame can reduce impact of an electromagnetic wave in the second PCB on other circuits.

In a possible implementation, the side frame includes a groove, and the groove is close to the antenna in package apparatus. The side frame is hollowed out to form a groove structure, such that the side frame has a relatively good support force while ensuring end-fire radiation of the antenna.

BRIEF DESCRIPTION OF DRAWINGS

To describe the technical solutions in the embodiments of this application or in the prior art more clearly, the following briefly describes the accompanying drawings for describing the embodiments or the prior art.

FIG. 10($b$) is a 3D view of the antenna in package apparatus;

Figure 1:
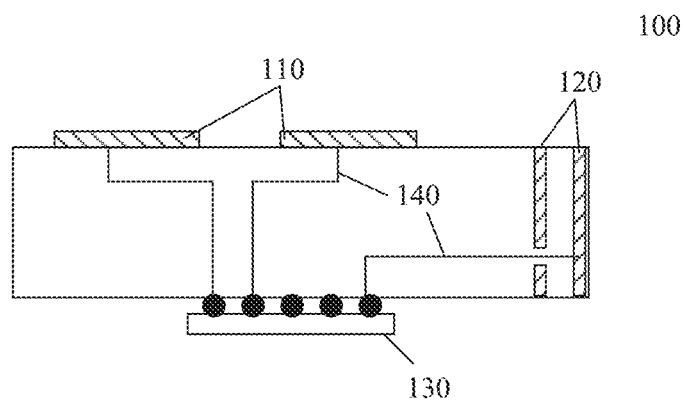
FIG. 1 shows an antenna in package in the prior art.

REFERENCE NUMERALS IN THE DRAWINGS an antenna in package device 250; a first substrate 300; a second substrate 260; a radio frequency processing chip 310; a BGA ball 312; a broadside antenna 320; a first radiator 330; a first metal piece 350; a second metal piece 352; a second radiator 340; a first feeding path 360; a first ground plate 332; a second ground plate 342; a first feeding path 360; a second feeding path 362; a first main radiation plate 334; a second main radiation plate 344; a first parasitic radiator 336; a second parasitic radiator 346; a first positive-polarized element 3342; a first negative-polarized element 3344; a second positive-polarized element 3444; a second negative-polarized element 3442; a first mechanical part 370; a third radiator 371; a third metal piece 372; a second mechanical part 373; a fourth radiator 374; a fourth metal piece 375; a PCB 262; a fifth radiator 376; and a fifth metal piece 377.

DESCRIPTION OF EMBODIMENTS

The following clearly describes the technical solutions in the embodiments of this application with reference to the accompanying drawings in the embodiments of this application. It is clearly that the described embodiments are merely some but not all of the embodiments of this application. All other embodiments obtained by a person of ordinary skill in the art based on the embodiments of this application without creative efforts shall fall within the protection scope of this application.

Figure 2:
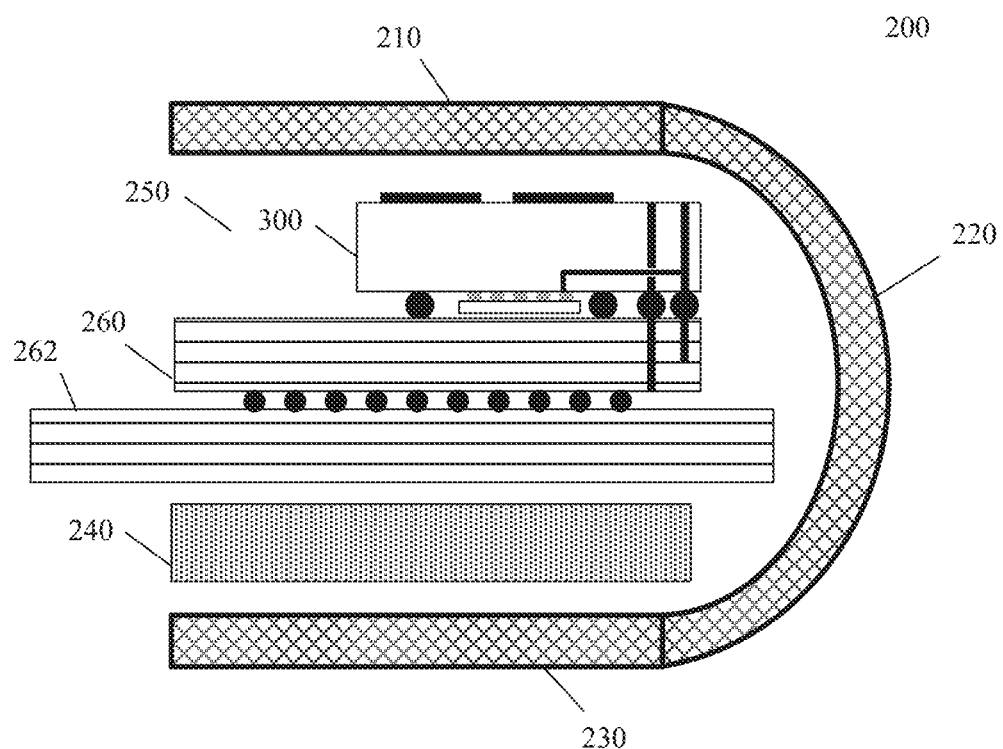
FIG. 2 is a schematic diagram of a cross-section structure of a terminal device according to an embodiment of this application.

FIG. 2 shows a schematic diagram of a cross-section structure of a terminal device 200 according to an embodiment of this application. The terminal device 200 may be a smartphone, a portable computer, a tablet computer, an electronic band, or another terminal device having a communication function. The terminal device 200 may include a rear cover 210, a side frame 220, a display apparatus 230, and a middle frame 240. The rear cover 210 and the display apparatus 230 are disposed opposite to each other, and are connected by using the side frame 220, to form a cavity between the rear cover 210 and the display apparatus 230. The middle frame 240 is disposed on a side that is of the display apparatus 230 and that faces the rear cover 210. An antenna in package apparatus 250 and a Printed Circuit Board (PCB) 262 are disposed between the rear cover 210 and the middle frame 240. The antenna in package apparatus 250 is disposed on a side that is of the PCB 262 and that faces the rear cover 210, and is electrically connected to the PCB 262 by using solder balls. The antenna in package apparatus 250 may be configured to receive, transmit, and process an electromagnetic wave signal. The antenna in package apparatus 250 includes a first substrate 300 and a second substrate 260. The first substrate 300 and the second substrate 260 may be connected by using metal connecting pieces such as solder balls.

Figure 3:
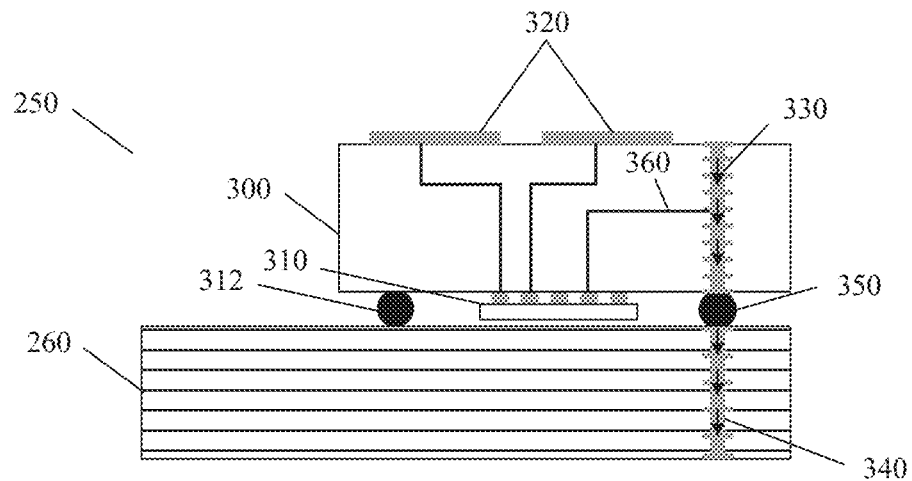
FIG. 3 is a schematic diagram of a cross-section structure of an antenna in package apparatus according to an embodiment of this application.

FIG. 3 shows a schematic diagram of a cross-section structure of an antenna in package apparatus 250 according to an embodiment of this application. The antenna in package apparatus 250 includes a first substrate 300 and a second substrate 260 that are disposed opposite to each other. The first substrate 300 may be an interposer implemented by using a passive silicon wafer. The second substrate 260 may also be an interposer, or a printed circuit board implemented by using a copper-clad laminate. The first substrate 300 is electrically connected to the second substrate 260 by using a BGA ball 312 disposed between the first substrate 300 and the second substrate 260. A radio frequency processing chip 310 is disposed on a side of a lower surface of the first substrate 300, namely, a side that is of the first substrate 300 and that faces the second substrate 260. The radio frequency processing chip 310 is configured to process a radio frequency signal, and is electrically connected to the first substrate 300 by using solder balls or another metal welding material. A side of an upper surface of the first substrate 300, namely, a side that is of the first substrate 300 and that is distant from the second substrate 260, is provided with broadside antennas 320, and maximum radiation directions of the broadside antennas 320 are parallel to a normal line of the radio frequency processing chip 310. It should be noted that, in this application, a direction in which the radio frequency processing chip 310 faces the first substrate 300 is defined as a normal direction of the radio frequency processing chip 310. For example, a vertical direction in FIG. 3 is the normal direction of the radio frequency processing chip 310. The radio frequency processing chip 310 may feed the broadside antennas 320 through a feeding path disposed in the first substrate 300, such that the broadside antennas 320 are excited to receive and transmit electromagnetic wave signals. The antenna in package apparatus 250 further includes an end-fire antenna. A maximum radiation direction of the end-fire antenna is perpendicular to the normal line of the radio frequency processing chip 310. The end-fire antenna includes a first radiator 330 and a second radiator 340 that have a same direction.

In the antenna in package apparatus 250, the first radiator 330 is disposed in the first substrate 300, the second radiator 340 is disposed in the second substrate 260, and the first radiator 330 is electrically connected to the second radiator 340 by using a first metal piece 350. A solder pad may be separately disposed at an end that is of the first radiator 330 and that is close to the second substrate 260 and an end that is of the second radiator 340 and that is close to the first substrate 300, such that the first metal piece 350 is connected to the first radiator 330 and the second radiator 340 more stably. The radio frequency processing chip 310 may also feed the first radiator 330 through the first feeding path 360 disposed in the first substrate 300, such that the first radiator 330 and the second radiator 340 are excited to receive and transmit electromagnetic wave signals. A vertical polarization current exists in the first radiator 330, the first metal piece 350, and the second radiator 340 that are excited, and a direction of the vertical polarization current is parallel to the normal direction of the radio frequency processing chip 310. Polarization manners for the foregoing antenna include horizontal polarization and vertical polarization, and may also include ±45° polarization. For example, when the end-fire antenna is excited by vertical polarization or ±45° polarization, a ±45° polarized current is generated in the end-fire antenna.

Because the first metal piece 350 connects the second radiator 340 and the first radiator 330, an equivalent height of the end-fire antenna changes from an original height of the first radiator 330 to a sum of heights of the first radiator 330, the first metal piece 350, and the second radiator 340. The equivalent height of the end-fire antenna is increased, such that a vertical polarization current path generated by the end-fire antenna may be distributed on the first radiator 330, the first metal piece 350, and the second radiator 340, that is, a polarization current path of the end-fire antenna in the vertical direction is increased. Therefore, a gain and a bandwidth of the end-fire antenna are improved. It should be noted that the equivalent height of the antenna in this application refers to a height of the end-fire antenna in the vertical direction, namely, a direction parallel to the normal line of the radio frequency processing chip 310.

In an implementation, the antenna in package apparatus 250 may further include a chip disposed on a side that is of the second substrate 250 and that is distant from the first substrate. The chip may be a Central Processing Unit (CPU) chip, or may be a cache chip, for example, a Dynamic Random Access Memory (DRAM). The chip is electrically connected to the second substrate 250 by using solder balls or another metal connecting piece.

Figure 4:
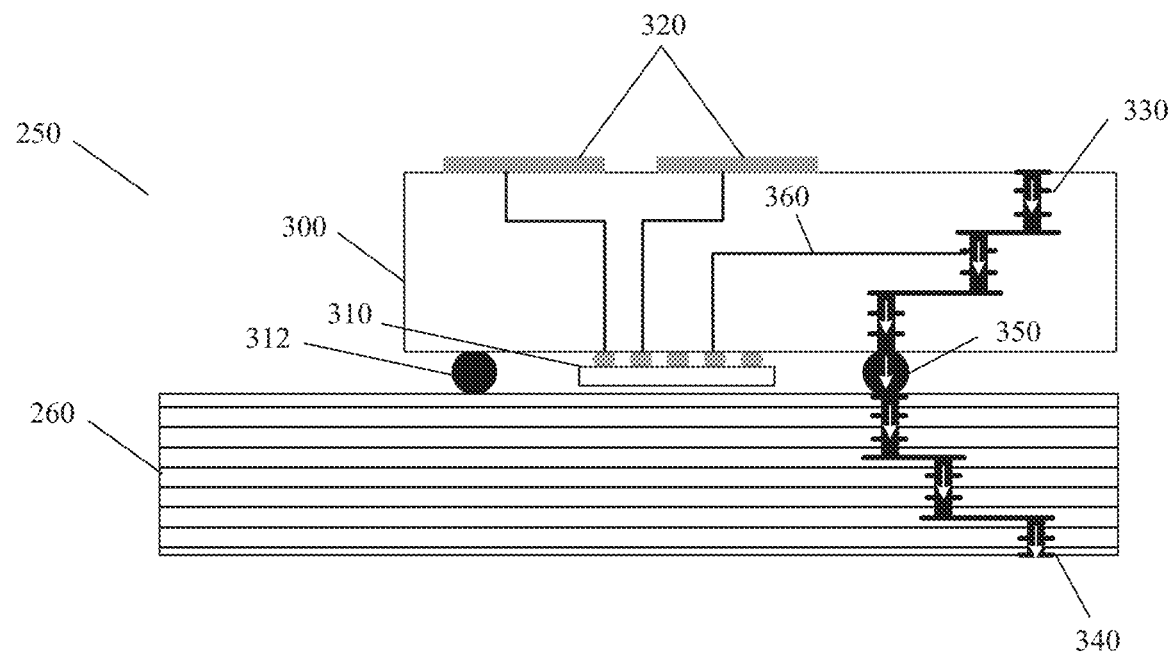
FIG. 4 is a schematic diagram of a cross-section structure of another antenna in package apparatus according to an embodiment of this application.

The first radiator 330 and the second radiator 340 may be implemented by using a via shown in FIG. 3, where the first radiator 330, the first metal piece 350, and the second radiator 340 are located on a straight line. FIG. 4 shows a schematic diagram of a cross-section structure of the antenna in package apparatus 250 in another implementation. For same reference numerals in FIG. 4, refer to FIG. 3. Different from FIG. 3, according to a required antenna type and cabling requirement, the first radiator 330 and the second radiator 340 in FIG. 4 may alternatively be implemented by using via arrays arranged in a staggered manner and interlayer cables (the interlayer cables are used to connect vias arranged in a staggered manner). In other words, processing such as bending is performed on the first radiator 330 and the second radiator 340, to increase the bandwidth of the antenna. Compared with the vias, an actual equivalent height implemented by using the via arrays arranged in a staggered manner and the interlayer cable is the same, and the vertical polarization current path may also be distributed on the first radiator 330, the first metal piece 350, and the second radiator 340 separately, to increase the gain and the bandwidth of the end-fire antenna.

Figure 5:
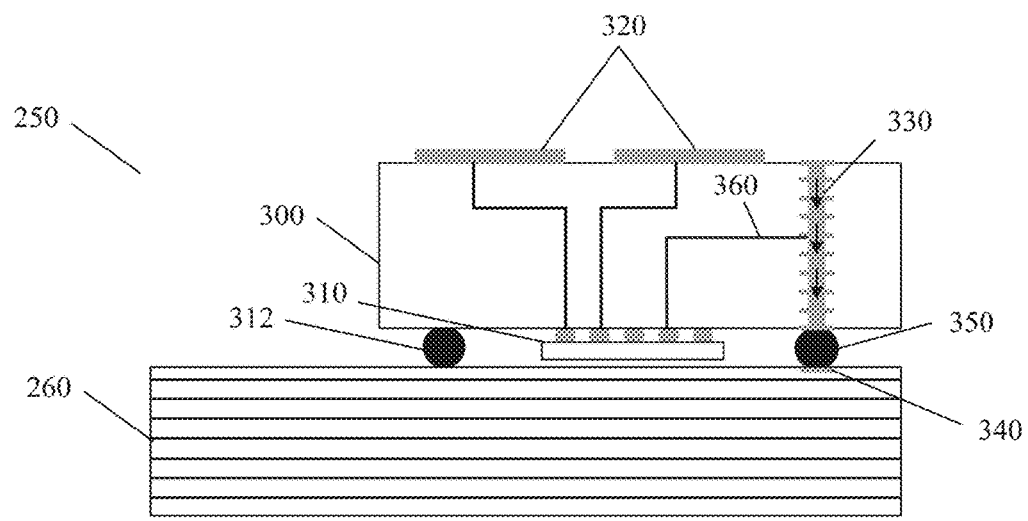
FIG. 5 is a schematic diagram of a cross-section structure of still another antenna in package apparatus according to an embodiment of this application.

FIG. 5 shows a schematic diagram of a cross-section structure of the antenna in package apparatus 250 in still another implementation. For same reference numerals in FIG. 5, refer to FIG. 3. Different from FIG. 3, the second radiator 340 in the antenna in package apparatus 250 in FIG. 5 may also be implemented by using a cable or a solder pad disposed on a side that is of the second substrate 260 and that faces the first substrate 300. Because the first metal piece 350 (for example, a solder ball) has a specific volume and height, the vertical polarization current path may alternatively be distributed in the first metal piece 350 and the second radiator 340, to improve the gain and the bandwidth of the end-fire antenna.

Figure 6:
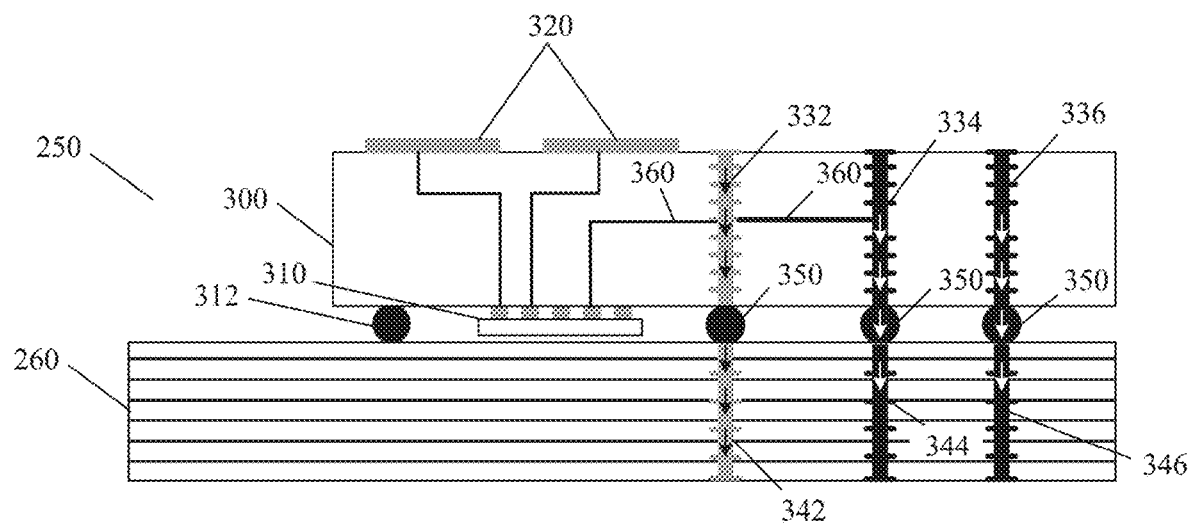
FIG. 6 is a schematic diagram of a cross-section structure of a more specific antenna in package apparatus according to an embodiment of this application.

FIG. 6 shows a schematic diagram of a cross-section structure of a more specific antenna in package apparatus 250 according to an embodiment of this application. For same reference numerals in FIG. 6, refer to FIG. 3. A difference lies in that a radiator in the antenna in package apparatus 250 in FIG. 6 may further include at least one of a ground plate, a main radiation plate, or a parasitic radiator. The ground plate is configured to reflect an electromagnetic wave signal and is also a signal reference ground. The main radiation plate is fed and transmits or receives an electromagnetic wave signal. As a director, the parasitic radiator can enhance directivity of an electromagnetic wave signal. In one embodiment, the first radiator 330 includes a first ground plate 332, a first main radiation plate 334, and a first parasitic radiator 336. Correspondingly, a second radiator 340 includes a second ground plate 342, a second main radiation plate 344, and a second parasitic radiator 346. The first ground plate 332 is connected to the second ground plate 342 by using an independent first metal piece 350, the first main radiation plate 334 is connected to the second main radiation plate 344 by using an independent first metal piece 350, and the first parasitic radiator 336 is connected to the second parasitic radiator 346 by using an independent first metal piece 350. A radio frequency processing chip 310 feeds the first main radiation plate 334 through a first feeding path 360, such that the first main radiation plate 334 and the second main radiation plate 344 are excited. The first parasitic radiator 336 and the second parasitic radiator 346 respectively generate resonance with the first main radiation plate 334 and the second main radiation plate 344, to improve directivity of antenna radiation. The first ground plate 332 and the second ground plate 342 are connected to a ground end of the radio frequency processing chip 310, to provide a signal reference ground. Because the first metal pieces 350 separately connect the first ground plate 332 with the second ground plate 342, the first main radiation plate 334 with the second main radiation plate 344, and the first parasitic radiator 336 with the second parasitic radiator 346, equivalent heights of ground plates, main radiation plates, and parasitic radiators of an end-fire antenna are increased, such that a polarization current path of the end-fire antenna in a vertical direction is increased, thereby increasing a gain and a bandwidth of the end-fire antenna.

It should be noted that the first ground plate 332, the first main radiation plate 334, the first parasitic radiator 336, the second ground plate 342, the second main radiation plate 344, and the second parasitic radiator 346 may be disposed according to an antenna design requirement and a substrate cabling requirement. For example, the first ground plate 332, the first feeding path 360, the first main radiation plate 334, and the first parasitic radiator 336 are disposed in the first substrate 300, and the second ground plate 342, the second main radiation plate 344, and the second parasitic radiator 346 are disposed in the second substrate 260 at the same time, or only the second ground plate 342 may be disposed in the second substrate 260. Quantities and specific locations of the ground plates, the main radiation plates, and the parasitic radiators are not limited in this application, but the second substrate 260 needs to include at least one of the second ground plate 342, the second main radiation plate 344, or the second parasitic radiator 346. The first feeding path 360 may direct feed the first main radiation plate 334, or may perform coupling feeding on the first main radiation plate 334. A feeding manner is not limited in this application. In addition, heights of the ground plates, the main radiation plates, and the parasitic radiators are not limited in this application. For example, if the first substrate 300 includes four wiring layers (a wiring layer closest to the second substrate 260 is the fourth layer), the first ground plate 332 may include a via from the third layer to the fourth layer of the first substrate 300, or may include a via from the first layer to the fourth layer of the first substrate 300.

Figure 7:
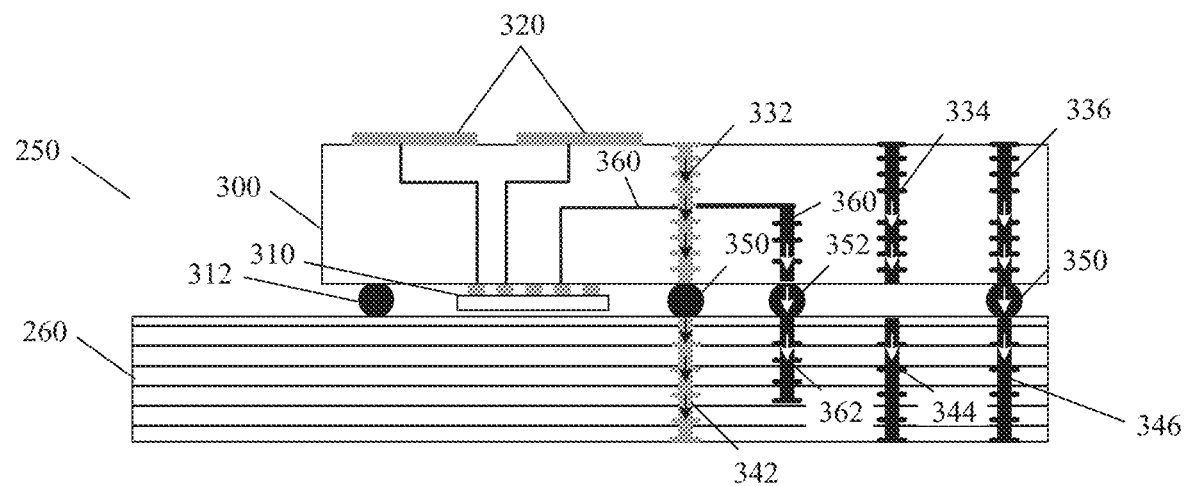
FIG. 7 is a schematic diagram of a cross-section structure of another more specific antenna in package apparatus according to another an embodiment of this application.

FIG. 7 shows a schematic diagram of a cross-section structure of another more specific antenna in package apparatus 250 according to an embodiment of this application. For same reference numerals in FIG. 7, refer to FIG. 6. Different from FIG. 6, in FIG. 7, the antenna in package apparatus 250 further includes a second feeding path 362 disposed in a second substrate 260. The second feeding path 362 is connected to a first feeding path 360 by using a second metal piece 352 disposed between a first substrate 300 and the second substrate 260. Different from FIG. 6, in FIG. 7, the first feeding path 360 performs coupling feeding on a first main radiation plate 334, and the second feeding path 362 performs coupling feeding on a second main radiation plate 344. There is no direct physical connection between the first main radiation plate 334 and the second main radiation plate 344. Because the feeding paths and the main radiation plates form coupling feeding, a vertical polarization current exists in both the first main radiation plate 334 and the second main radiation plate 344, and equivalent heights of the main radiation plates are increased, thereby increasing a polarization current path of an end-fire antenna in a vertical direction. Therefore, a gain and a bandwidth of the end-fire antenna are improved.

Similar to a first radiator 330 and a second radiator 340, the first feeding path 360 and the second feeding path 362 may also be implemented by using vias, or by using via arrays and interlayer cables (the interlayer cables are used to connect vias that are arranged in a staggered manner). In this way, a volume of the antenna in package apparatus 250 is reduced, and the bandwidth of the antenna is increased.

The first metal piece 350 and the second metal piece 352 may solder balls, for example, ball grid array Ball Grid Array (BGA) balls, or other mechanical parts with electrical conductivity. A solder pad may be respectively disposed at an end that is of the first feeding path 360 and that is close to the second substrate 260 and an end that is of the second feeding path 362 and that is close to the first substrate 300, such that the first metal piece 352 is connected to the first feeding path 360 and the second feeding path 362 more stably.

Figure 8:
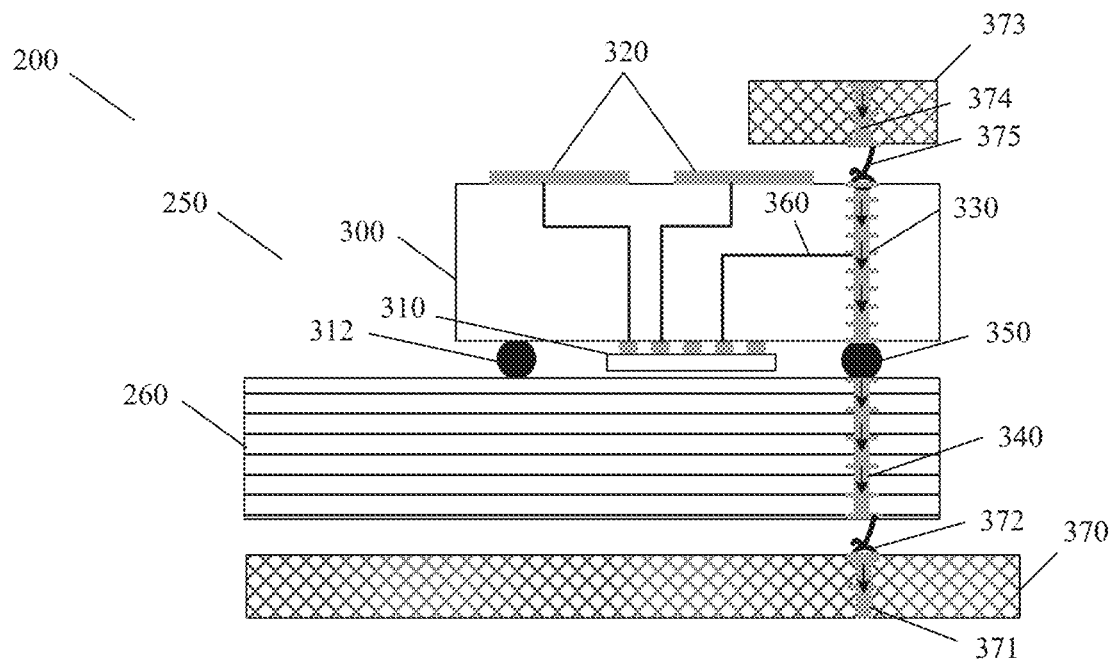
FIG. 8 is a schematic diagram of a cross-section structure of another terminal device according to an embodiment of this application.

FIG. 8 shows a schematic diagram of a cross-section structure of another terminal device 200 according to an embodiment of this application. The terminal device 200 includes an antenna in package apparatus 250, a first mechanical part 370, and a second mechanical part 373. The antenna in package apparatus 250 may be any antenna in package apparatus provided in the embodiments of this application. The first mechanical part 370 is disposed below a second substrate 260, to be specific, disposed on a side that is distant from a first substrate 300. The first mechanical part 370 includes a third radiator 371 disposed therein. The third radiator 371 is connected to a second radiator 340 by using a third metal piece 372. The third metal piece 372 is disposed between the second substrate 260 and the first mechanical part 370. The second mechanical part 373 is disposed above the first substrate 300, to be specific, disposed on a side that is distant from the second substrate 260. The second mechanical part 373 includes a fourth radiator 374 disposed therein. The fourth radiator 374 is connected to a first radiator 330 by using a fourth metal piece 375. The fourth metal piece 375 is disposed between the first substrate 300 and the second mechanical part 373.

The first mechanical part 370 and the second mechanical part 373 may be side frames or middle frames in the terminal device, or may be mechanical parts in another terminal device. The third metal piece 372 and the fourth metal piece 375 may be metal lapping lines, or may be other lapping lines or connecting balls having a conductive function. The third radiator 371 and the fourth radiator 374 may be implemented by using vias, or by using via arrays and interlayer cables (the interlayer cables are used to connect vias arranged in a staggered manner), or may be implemented by using metal columns and metal-plated cables. In an implementation, another mechanical part, another radiator, and another metal piece may be disposed, according to a design requirement of the terminal device 200, on a side that is of the first mechanical part 370 and that is distant from the first substrate 300. In an implementation, another mechanical part, another radiator, and another metal piece may be disposed on a side that is of the second mechanical part 373 and that is distant from the first substrate 300. In another implementation, only the first mechanical part 370, the third radiator 371, and the third metal piece 372 may be disposed, or only the second mechanical part 373, the fourth radiator 374, and the fourth metal piece 375 are disposed. Quantities of the mechanical parts, the radiators, and the metal pieces in the terminal device 200 are not limited in this application.

Figure 9:
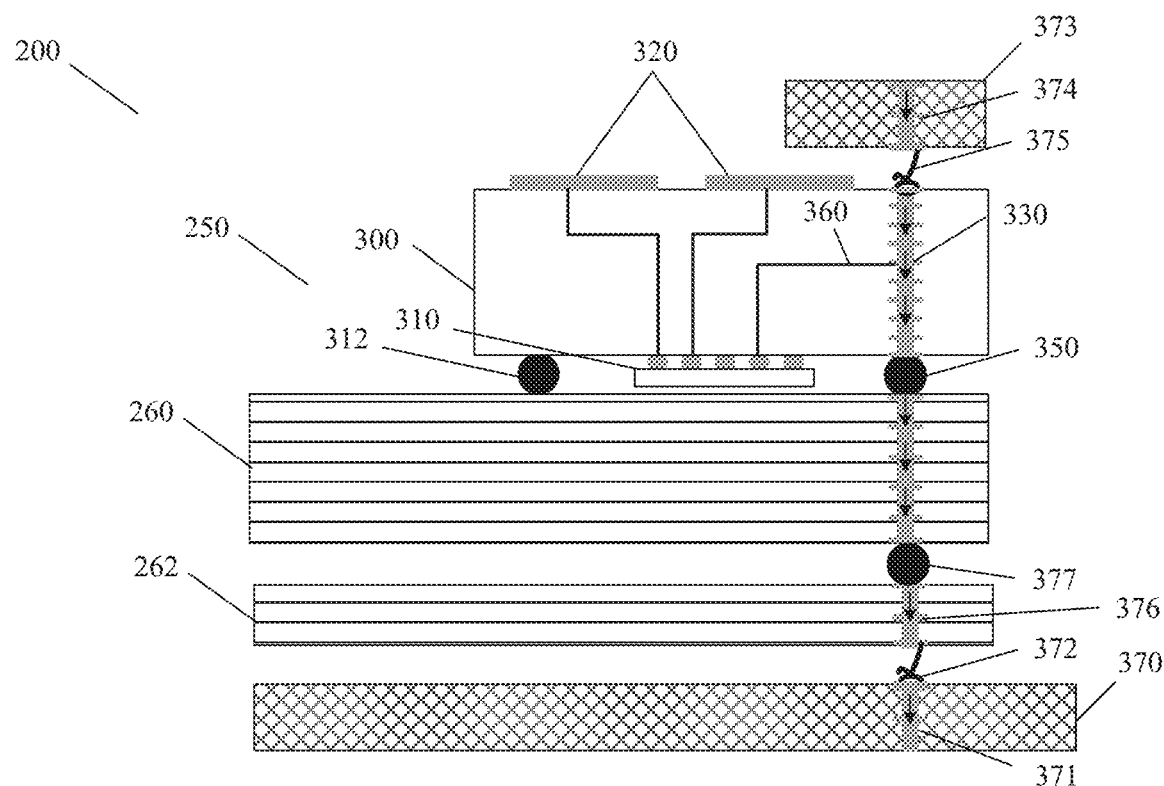
FIG. 9 is a schematic diagram of a cross-section structure of still another terminal device according to an embodiment of this application.

FIG. 9 shows a schematic diagram of a cross-section structure of still another terminal device 200 according to an embodiment of this application. For same reference numerals in FIG. 9, refer to FIG. 8. Different from FIG. 8, the terminal device 200 in FIG. 9 further includes a PCB 262. The PCB 262 may be disposed between a second substrate 260 and a first mechanical part 370. In one embodiment, the PCB 262 includes a fifth radiator 376 disposed in the PCB 262. One end of the fifth radiator 376 is connected to a second radiator 340 by using a fifth metal piece 377 disposed between the second substrate 260 and the PCB 262. In addition, the other end of the fifth radiator 376 is connected to a third radiator 371 by using a third metal piece 372 disposed between the PCB 262 and the first mechanical part 370. In an implementation, the second substrate 260 may be a high-frequency PCB board, and is configured to transmit and process a high-frequency signal. The PCB 262 may be a low-frequency PCB board, and is configured to transmit and process an intermediate-frequency signal and a low-frequency signal. In an implementation, according to a design requirement, another PCB may be disposed on a side that is of the first mechanical part 370 and that faces a first substrate 300, or another PCB may be disposed on a side that is of a second mechanical part 373 and that faces the first substrate 300. A quantity and locations of PCBs of the PCBs in the terminal device 200 are not limited in this application.

The fifth metal piece 377 may be a metal lapping line, or may be another lapping line or connecting ball having a conductive function. The fifth radiator 376 may be implemented by using a via, or by using a via array and an interlayer cable (the interlayer cable is used to connect vias arranged in a staggered manner), or may be implemented by using a metal column and a metal-plated cable. Similar to a first radiator 330 and the second radiator 340, the third radiator 371, a fourth radiator 374, and the fifth radiator 376 each include at least one of a ground plate, a main radiation plate, or a parasitic radiator. Details are not described herein again.

Figure 10A:
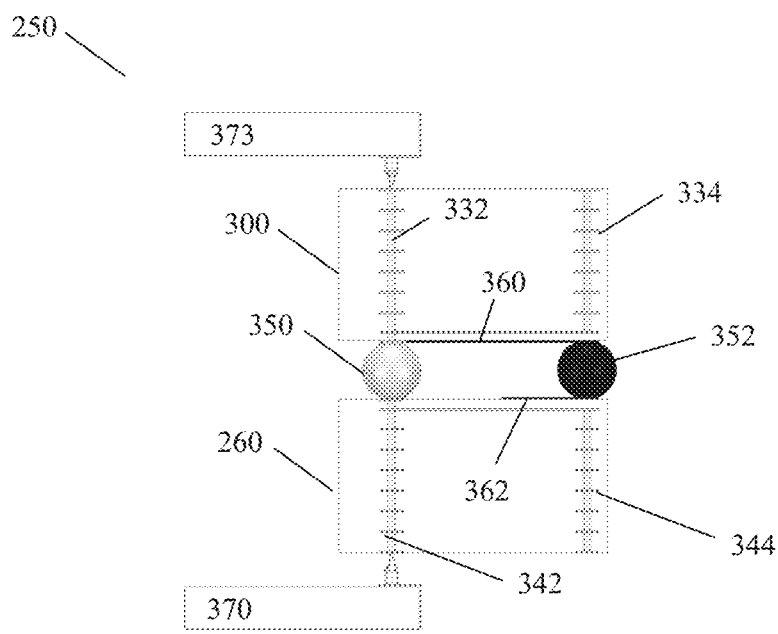
FIG. 10($a$) is a schematic diagram of a cross-section structure of still another more specific antenna in package apparatus according to an embodiment of this application.
Figure 10B:
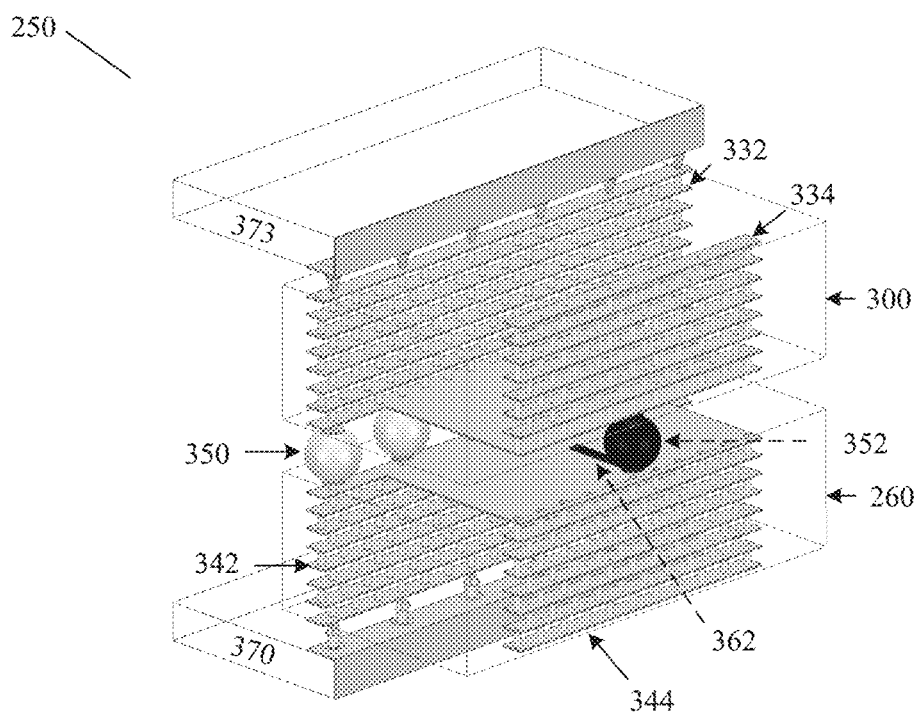

FIG. 10(a) shows a schematic diagram of a cross-section structure of still another more specific antenna in package apparatus 250 according to an embodiment of this application, and FIG. 10(b) is a 3D view of the antenna in package apparatus 250. For same reference numerals in FIG. 10(a) and FIG. 10(b), refer to FIG. 8. Different from FIG. 8, the antenna in package apparatus 250 in FIG. 10(a) and FIG. 10(b) performs coupling feeding on a first main radiation plate 334 and a second main radiation plate 344 by using a feeding path having an "η"-shaped bent structure. In one embodiment, the first main radiation plate 334 is electrically connected to a first ground plate 332, the second main radiation plate 344 is electrically connected to a second ground plate 342, and the first ground plate 332 is connected to the second ground plate 342 by using a first metal piece 350. However, no direct connection relationship is formed between the first main radiation plate 334 and the second main radiation plate 344. A first feeding path 360 and a second feeding path 362 are respectively disposed in a first substrate 300 and a second substrate 260, are connected by using a second metal piece 352, and perform coupling feeding on the first main radiation plate 334 and the second main radiation plate 344. In an implementation, the first feeding path 360 and the second feeding path 362 may be respectively disposed in a middle wiring layer of the first substrate 300 and a middle wiring layer of the second substrate 260. In another implementation, the first feeding path 360 and the second feeding path 362 may be respectively disposed on a side that is of the first substrate 300 and that faces the second substrate 260 and a side that is of the second substrate 260 and that faces the first substrate 300. The first feeding path 360 is connected to the second feeding path 362 by using the second metal piece 352, to form an "η"-shaped bent structure. The first feeding path 360 is mainly configured to perform coupling feeding on the first main radiation plate 334, and the second feeding path 362 is mainly configured to perform coupling feeding on the second main radiation plate 344. Each of the first main radiation plate 334, the second main radiation plate 344, the first ground plate 332, and the second ground plate 342 may be in a form of a balanced dipole, and an operating bandwidth is increased through widening processing.

Figure 11A:
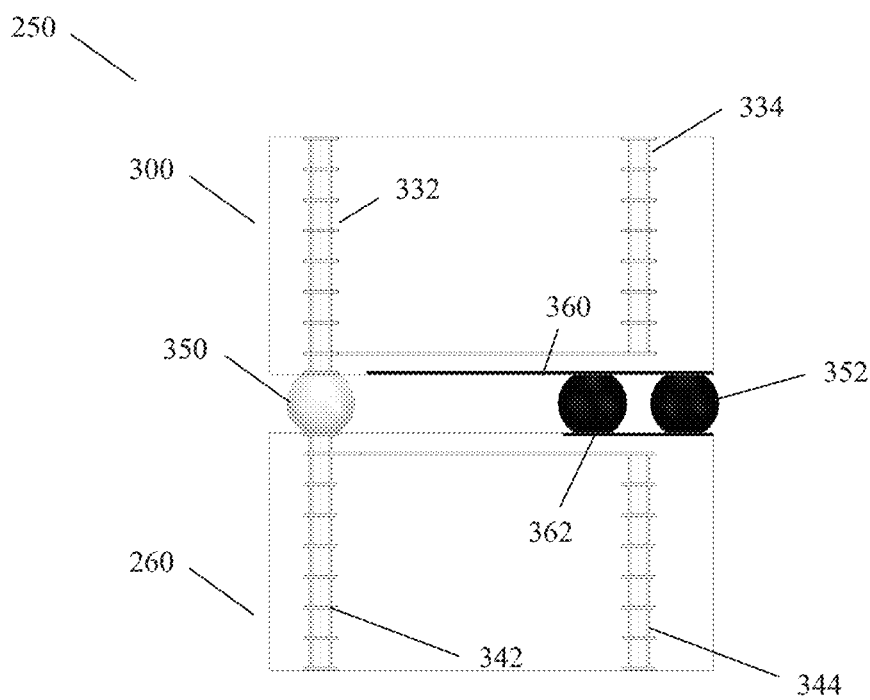
FIG. 11(a) is a schematic diagram of a cross-section structure of still another more specific antenna in package apparatus according to an embodiment of this application.
Figure 11B:
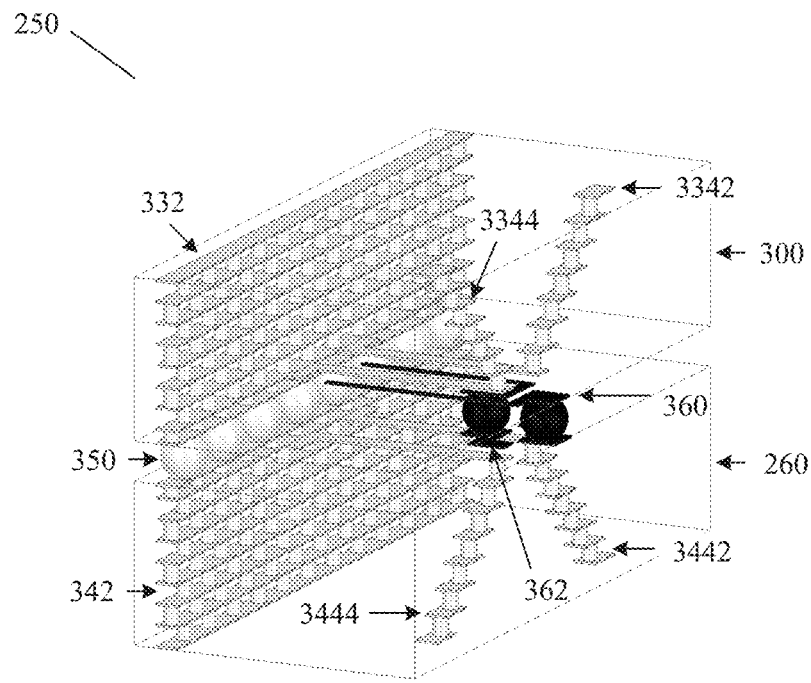
FIG. 11(b) is a 3D view of the antenna in package apparatus.

FIG. 11(a) shows a schematic diagram of a cross-section structure of still another more specific antenna in package apparatus 250 according to an embodiment of this application, and FIG. 11(b) is a 3D view of the antenna in package apparatus 250. For same reference numerals in FIG. 11(a) and FIG. 11(b), refer to FIG. 10(a) and FIG. 10(b). A difference lies in that an antenna in the antenna in package apparatus 250 in FIG. 11(a) and FIG. 11(b) is a ±45° dual-polarized antenna. In one embodiment, a first main radiation plate 334 in the antenna in package apparatus 250 includes a first positive-polarized element 3342 and a first negative-polarized element 3344. A second main radiation plate 344 includes a second positive-polarized element 3444 and a second negative-polarized element 3442. An included angle between the first positive-polarized element 3342 and the first negative-polarized element 3344 is 90°, and an included angle between the second positive-polarized element 3444 and the second negative-polarized element 3442 is also 90°. According to the foregoing structure, ±45° dual polarization of an antenna can be implemented. A part of a first feeding path 360 is configured to perform −45° polarization on the first negative-polarized element 3344, a part of a second feeding path 362 is configured to perform −45° polarization on the second negative-polarized element 3442, and the two parts of the feeding paths are connected by using a second metal piece 352. The other part of the first feeding path 360 is configured to perform +45° polarization on the first positive-polarized element 3342, the other part of the second feeding path 362 is configured to perform +45° polarization on the second positive-polarized element 3444, and the two parts of the feeding paths are connected by using a second metal piece 352. The feeding paths configured to perform +45° polarization and the feeding paths configured to perform −45° polarization are separately crossed by using the second metal piece 352, and amplitude-phase requirements of two feeding signals are ensured by adjusting front and back positions of the second metal piece 352 and adjusting bending of cabling, to form a complete ±45° dual-polarized antenna.

Figure 12:
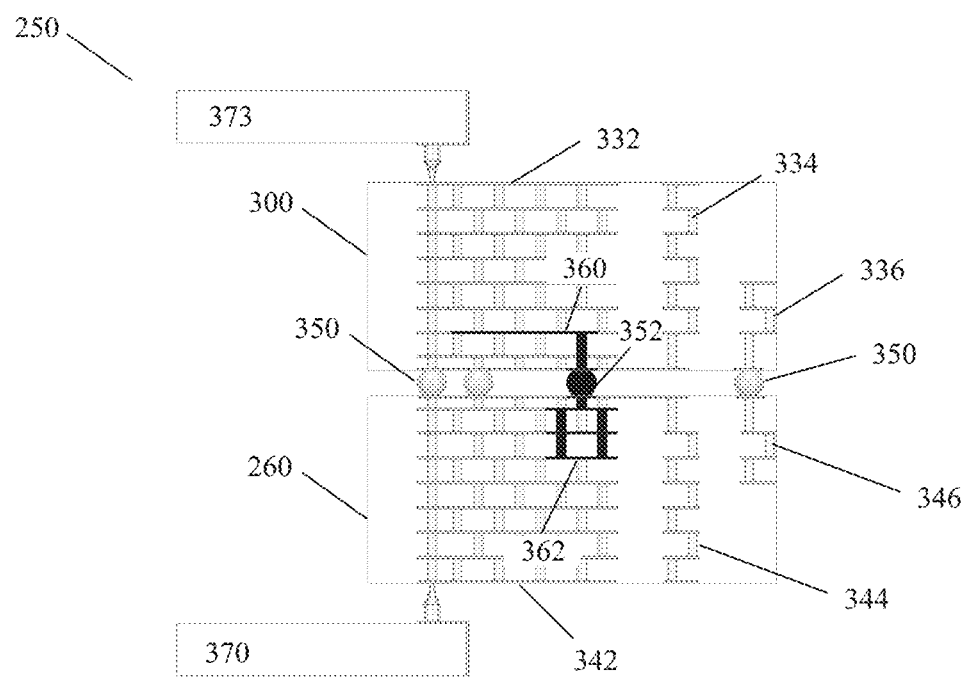
FIG. 12 is a schematic diagram of a cross-section structure of still another more specific antenna in package apparatus according to an embodiment of this application.

FIG. 12 shows a schematic diagram of a cross-section structure of still another more specific antenna in package apparatus 250 according to an embodiment of this application. For same reference numerals in FIG. 12, refer to FIG. 10(a). Different from FIG. 10(a), a first (a) feeding path 260 and a second feeding path 362 in the antenna in package apparatus 250 in FIG. 12 feed a first main radiation plate 334 and the second main radiation plate 344 in a coupling feeding manner. In one embodiment, the antenna in package apparatus 250 further includes a first parasitic radiator 336 and a second parasitic radiator 346, and the first parasitic radiator 336 and the second parasitic radiator 346 are connected by using a first metal piece 350. Each of the first feeding path 360, the second feeding path 362, a first ground plate 332, a second ground plate 342, the first main radiation plate 334, the second main radiation plate 344, the first parasitic radiator 336, and the second parasitic radiator 346 in the antenna in package apparatus 250 may be implemented by using symmetrical and staggered via arrays and a cable. The first feeding path 360 and the second feeding path 362 are partially communicated by using a second metal piece 352 to form a coupling gap. A width of the coupling gap may be adjusted based on a size of the second metal piece 352, and a length of the coupling gap may be controlled by adjusting a quantity of the first metal pieces 350.

Figure 13A:
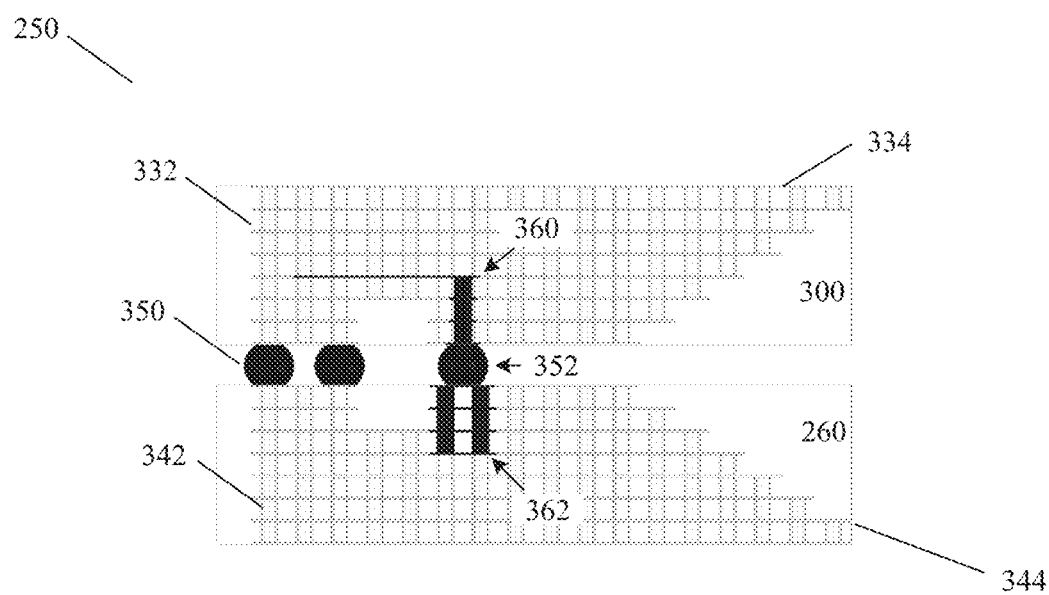
FIG. 13(a) is a schematic diagram of a cross-section structure of still another more specific antenna in package apparatus according to an embodiment of this application.
Figure 13B:
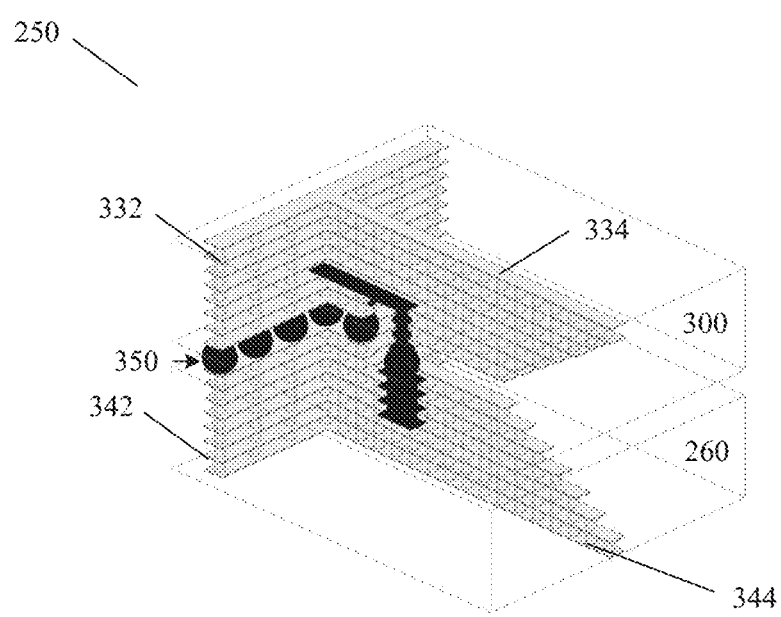
FIG. 13(b) is a 3D view of the antenna in package apparatus.

FIG. 13(a) shows a schematic diagram of a cross-section structure of still another more specific antenna in package apparatus 250 according to an embodiment of this application, and FIG. 13(b) is a 3D view of the antenna in package apparatus 250. For same reference numerals in FIG. 13(a) and FIG. 13(b), refer to FIG. 12. A difference lies in that an antenna in the antenna in package apparatus 250 in FIG. 13(a) and FIG. 13(b) is a Vivaldi antenna. A first main radiation plate 334 (disposed in a first substrate 300) and a second main radiation plate 344 (disposed in a second substrate 260) of the antenna in package apparatus 250 are horn-shaped, an exponential gap structure is used to control an electromagnetic wave to radiate electromagnetic energy from one end of a gap to an open end. Each of a first ground plate 332, a second ground plate 342, the first main radiation plate 334, the second main radiation plate 344, a first feeding path 360, and a second feeding path 362 is implemented by using an interlayer cable and a via or via arrays. A feeding position and a coupling quantity may be controlled by adjusting a position and an offset of the via respectively. To increase an aperture of a horn antenna, equivalent heights of the first main radiation plate 334 and the second main radiation plate 344 may be increased by using a plurality of layers of substrates and a plurality of layers of PCBs.

Figure 14A:
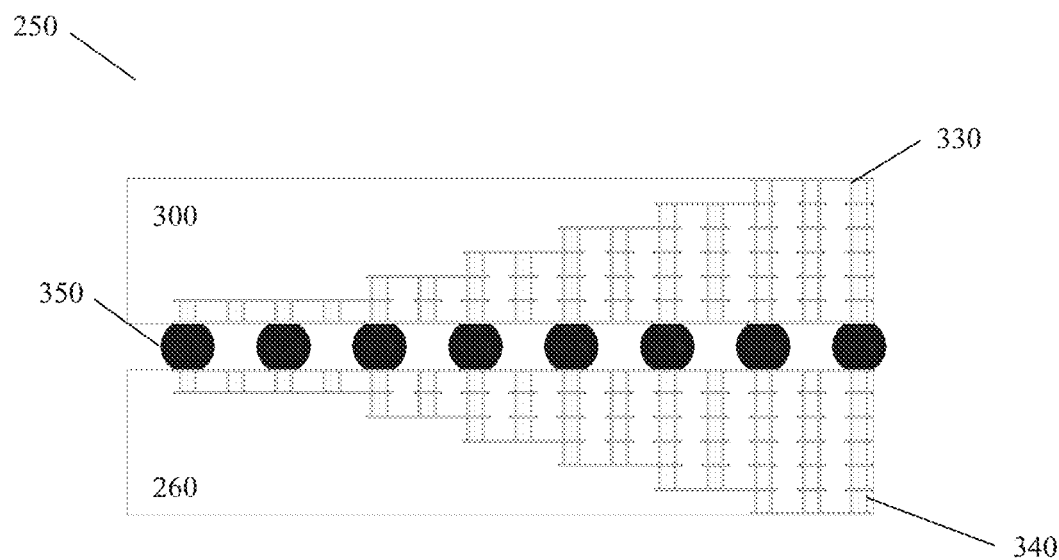
FIG. 14(a) is a schematic diagram of a cross-section structure of still another more specific antenna in package apparatus according to an embodiment of this application.
Figure 14B:
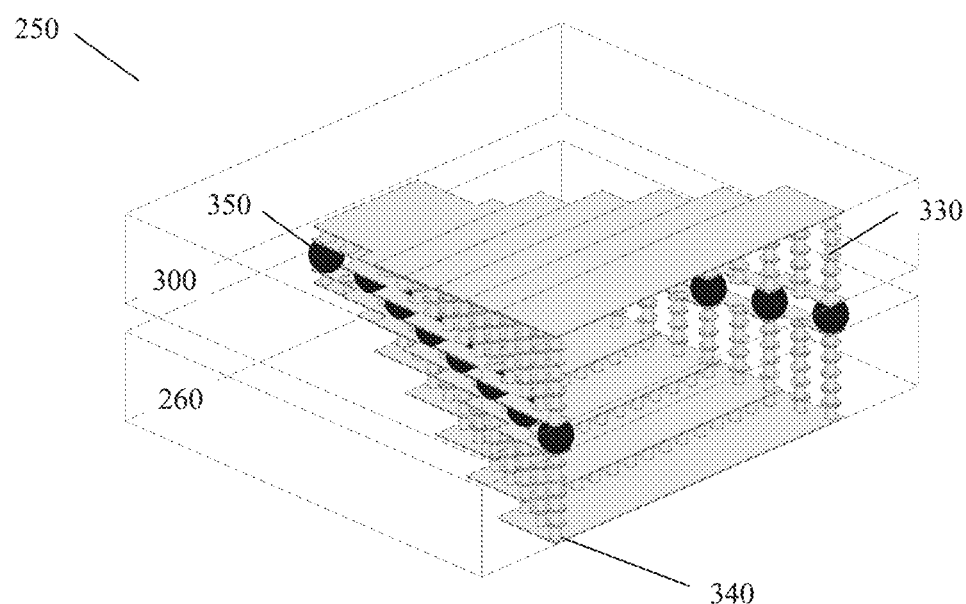
FIG. 14(b) is a 3D view of the antenna in package apparatus.

FIG. 14(a) shows a schematic diagram of a cross-section structure of still another more specific antenna in package apparatus 250 according to an embodiment of this application, to implement a horn antenna. FIG. 14(b) is a 3D view of the antenna in package apparatus 250. For same reference numerals in FIG. 14(a) and FIG. 14(b), refer to FIG. 12. A difference lies in that an antenna in the antenna in package apparatus 250 in FIG. 14(a) and FIG. 14(b) is a horn antenna. In one embodiment, a first radiator 330 (disposed in a first substrate 300) and a second radiator 340 (disposed in a second substrate 260) in the antenna in package apparatus 250 may be of a symmetric structure, and form a horn-shaped radiator by using interlayer cables and via arrays. Because the first radiator 330 and the second radiator 340 form a cavity structure, an electric field forms resonance in the cavity, and radiates an electromagnetic wave. To increase an aperture of the horn antenna, equivalent heights of the first radiator 330 and the second radiator 340 may also be increased by using a plurality of layers of substrates and a plurality of layers of PCBs. In the antenna in package apparatus 250, a direct feeding manner or a coupling feeding manner may be used. A specific feeding manner is not limited in this application.

Figure 15A:
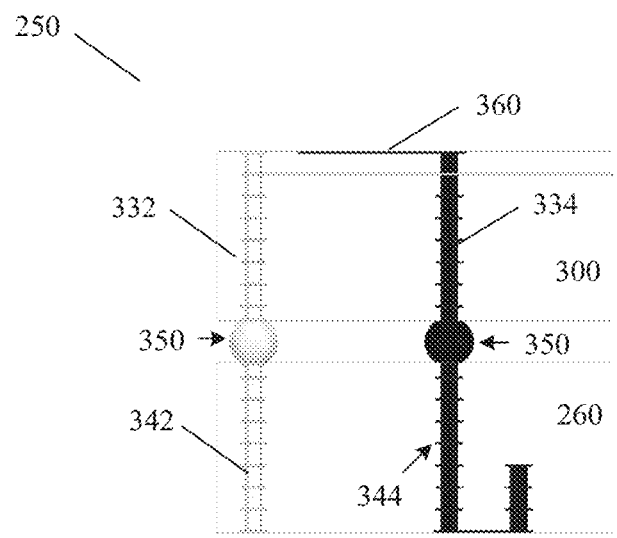
FIG. 15(a) is a schematic diagram of a cross-section structure of still another more specific antenna in package apparatus according to an embodiment of this application.
Figure 15B:
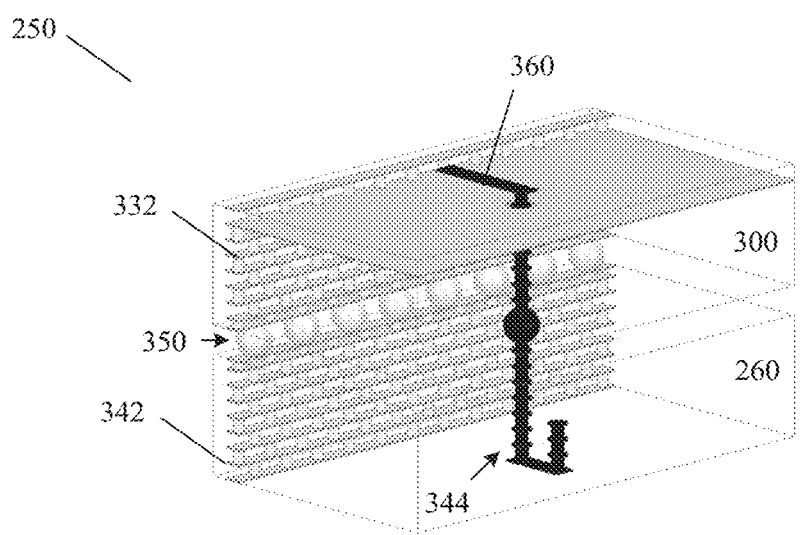
FIG. 15(b) is a 3D view of the antenna in package apparatus.

FIG. 15(a) shows a schematic diagram of a cross-section structure of a more specific antenna in package apparatus 250 according to an embodiment of this application, and FIG. 15(b) is a 3D view of the antenna in package apparatus 250. For same reference numerals in FIG. 15(a) and FIG. 15(b), refer to FIG. 10(a) and FIG. 10(b). A difference lies in that an antenna in the antenna in package apparatus 250 in FIG. 15(a) and FIG. 15(b) is a monopole antenna. In one embodiment, a first main radiation plate 334 in the antenna in package apparatus 250 is connected to a first ground plate 332, and a first feeding path 360 feeds the first main radiation plate 334. According to a design requirement of the antenna, a second main radiation plate 344 may be bent to meet a low-frequency working requirement of the antenna.

Figure 16A:
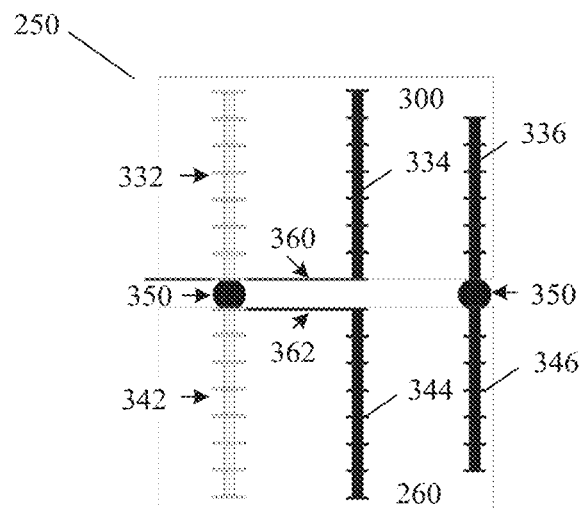
FIG. 16(a) is a schematic diagram of a cross-section structure of still another more specific antenna in package apparatus according to an embodiment of this application.
Figure 16B:
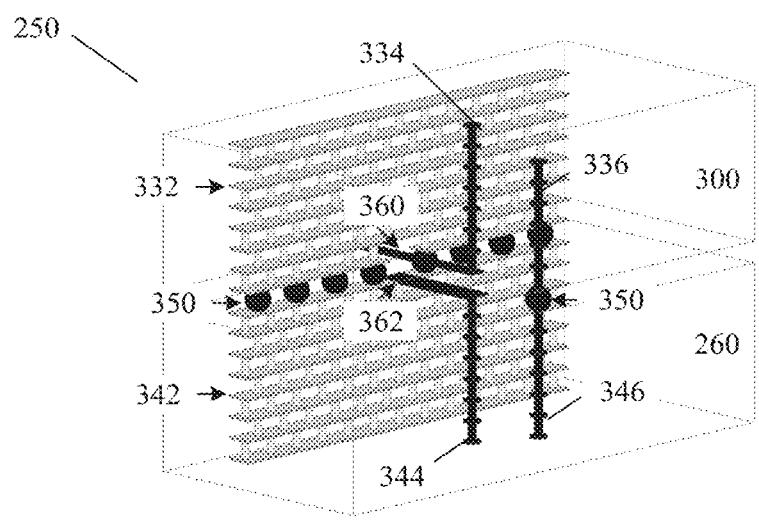
FIG. 16(b) is a 3D view of the antenna in package apparatus.

FIG. 16(a) shows a schematic diagram of a cross-section structure of a more specific antenna in package apparatus 250 according to an embodiment of this application, and FIG. 16(b) is a 3D view of the antenna in package apparatus 250. For same reference numerals in FIG. 16(a) and FIG. 16(b), refer to FIG. 14(a) and FIG. 14(b). A difference lies in that an antenna in the antenna in package apparatus 250 in FIG. 16(a) and FIG. 16(b) is a Yagi antenna. In one embodiment, the antenna in package apparatus 250 further includes a first parasitic radiator 336 and a second parasitic radiator 346 that are connected by using a first metal piece 350. A first feeding path 360 is configured to feed a first main radiation plate 334, and a second feeding path 362 is configured to short-circuit a second main radiation plate 344 and a second ground plate 342, to form a Yagi antenna having an end-fire feature.

Figure 17:
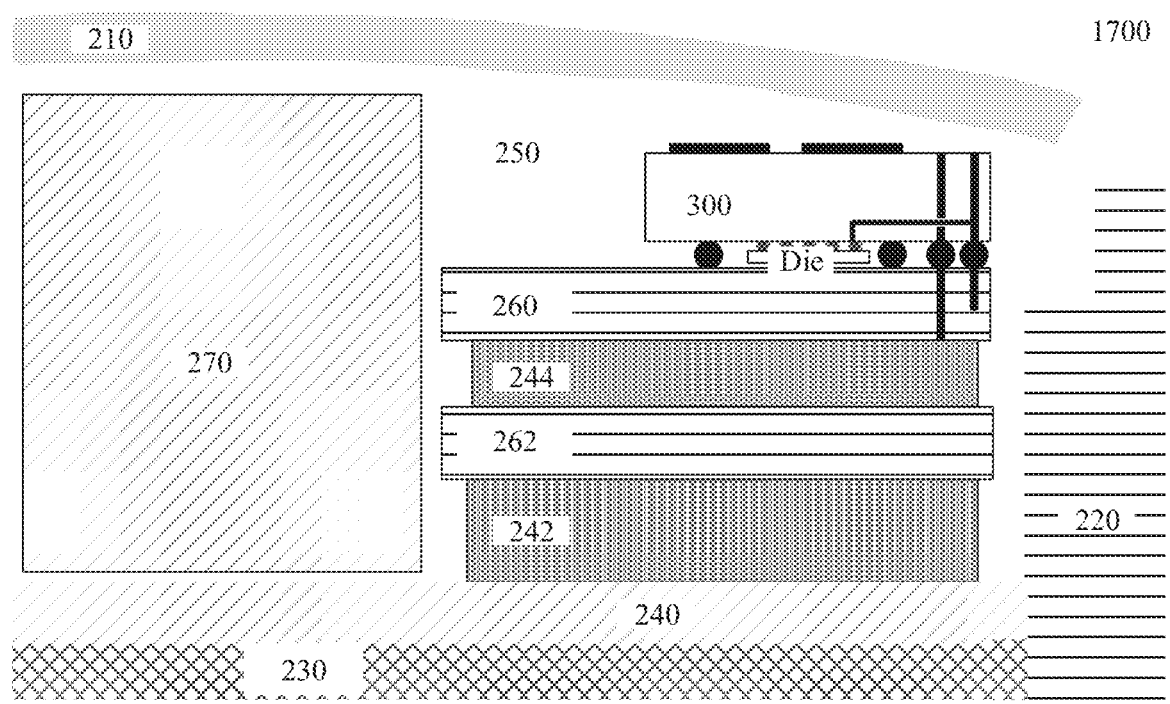
FIG. 17 is a schematic diagram of a cross-section structure of a more specific terminal device according to an embodiment of this application.

An embodiment of this application further provides a more specific terminal device 1700. FIG. 17 is a schematic diagram of a cross-section structure of the terminal device 1700. The terminal device 1700 includes a rear cover 210, a side frame 220, a display apparatus 230, a middle frame 240, a first shielding frame 242, a second shielding frame 244, an antenna in package apparatus 250, a PCB 262, and an electronic component 270. The antenna in package apparatus 250 may be any antenna in package apparatus in the embodiments of this application. For ease of description, a direction perpendicular to the middle frame 240 is used as a vertical direction, and a direction parallel to the middle frame 240 is used as a horizontal direction. The middle frame 240 is disposed on one side of the display apparatus 230. The first shielding frame 242, the PCB 262, the second shielding frame 244, and the antenna in package apparatus 250 are sequentially disposed in a stacked manner in a vertical direction distant from the middle frame 240. The antenna in package apparatus 250 includes a first substrate 300 and a second substrate 260 that are electrically connected. Whether the first shielding frame 242 and the PCB 262 are disposed may be determined based on a cross-sectional height of the terminal device 1700 and according to an actual requirement. The middle frame 240 and the display apparatus 230 are connected to one end of the side frame 220, and the other end of the side frame is connected to the rear cover 210. The electronic component 270 is disposed on a side that is of the middle frame 240 and that is distant from the display apparatus 230, and is located in a horizontal direction that is of the antenna in package apparatus 250 and that is distant from the side frame 220. The rear cover 210 is disposed on sides that are of the antenna in package apparatus 250 and the electronic device 270 respectively and that are distant from the middle frame 240, and may be connected to and fastened to the side frame 220 by using a mechanical part or an adhesive. The electronic component 270 may be a sensor or another electronic component. The first shielding frame 242 and the second shielding frame 244 are configured to shield interference electromagnetic waves from the PCB 262 and the second substrate 260. Both the second substrate 260 and the PCB 262 may be high-frequency or low-frequency printed circuit boards, and component setting and circuit placing and routing may be performed on the second substrate 260 and the PCB 262. As shown in FIG. 17, to better perform end-fire radiation between the rear cover 210 and the side frame 220 by using an electromagnetic wave, a part that is of the side frame 220 and that is close to the antenna in package apparatus 250 may be hollowed out, such that the side frame 220 has a relatively good supporting force while ensuring that the antenna performs end-fire radiation.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An antenna-in-package apparatus comprising:
    an end-fire antenna, wherein the end-fire antenna comprises a first radiator and a second radiator;
    a first feeding path configured to feed the first radiator;
    an interposer, wherein the first radiator and the first feeding path are disposed in the interposer;
    a printed circuit board (PCB), wherein the second radiator is disposed in the PCB; and
    a first metal piece, wherein the second radiator and the first radiator are connected using the first metal piece disposed between the interposer and the PCB.

2. The apparatus of claim 1, wherein the apparatus further comprises:
    a second feeding path disposed in the PCB; and
    a second metal piece disposed between the interposer and the PCB, wherein the second feeding path is configured to feed the second radiator, and wherein the first feeding path and the second feeding path are connected by the second metal piece.

3. The apparatus of claim 1, wherein the first radiator comprises a first ground plate, wherein the second radiator comprises a second ground plate, and wherein the first ground plate and the second ground plate are connected by the first metal piece.

4. The apparatus of claim 1, wherein the first radiator comprises a first parasitic radiator, wherein the second radiator comprises a second parasitic radiator, and wherein the first parasitic radiator and the second parasitic radiator are connected by the first metal piece.

5. The apparatus of claim 1, wherein the first radiator comprises a first main radiation plate, wherein the second radiator comprises a second main radiation plate, and wherein the first main radiation plate and the second main radiation plate are connected by the first metal piece disposed between the interposer and the PCB.

6. The apparatus of claim 5, wherein the first main radiation plate comprises a first positive-polarized element and a first negative-polarized element that are perpendicular to each other, and wherein the second main radiation plate comprises a second positive-polarized element and a second negative-polarized element that are perpendicular to each other.

7. The apparatus of claim 2, wherein the first radiator comprises a first main radiation plate, the second radiator comprises a second main radiation plate, wherein the first feeding path is configured to perform coupling feeding on the first main radiation plate, and wherein the second feeding path is configured to perform coupling feeding on the second main radiation plate.

8. The apparatus of claim 2, wherein the apparatus further comprises a chip disposed on a side of the interposer that faces the PCB, wherein the chip is configured to provide a radio frequency signal for the first feeding path and the second feeding path.

9. The apparatus of claim 8, wherein maximum radiation directions of the first radiator and the second radiator are perpendicular to a normal line of the chip.

10. The apparatus of claim 2, wherein the first metal piece and the second metal piece are ball grid array (BGA) balls.

11. The apparatus of claim 2, wherein at least one of the first radiator, the second radiator, the first feeding path, or the second feeding path comprises a via.

12. The apparatus of claim 2, wherein at least one of the first radiator, the second radiator, the first feeding path, or the second feeding path comprises via arrays arranged in a staggered manner and a cable for connecting the via arrays.

13. A terminal device, comprising an antenna-in-package apparatus, wherein the antenna-in-package apparatus comprises:
an end-fire antenna, wherein the end-fire antenna comprises a first radiator and a second radiator;
a first feeding path configured to feed the first radiator;
an interposer, wherein the first radiator and the first feeding path are disposed in the interposer;
a printed circuit board (PCB), wherein the second radiator is disposed in the PCB; and
a first metal piece, wherein the second radiator and the first radiator are connected using the first metal piece disposed between the interposer and the PCB.

14. The terminal device of claim 13, wherein the terminal device further comprises a third radiator, a first mechanical part, and a third metal piece, wherein the first mechanical part is disposed on a side of the PCB that is distant from the interposer, wherein the third radiator is disposed on the first mechanical part, wherein the first feeding path is further configured to feed the third radiator, and wherein the third radiator and the second radiator are connected by the third metal piece disposed between the PCB and the first mechanical part.

15. An antenna-in-package apparatus, comprising:
a first radiator;
a first feeding path configured to feed the first radiator;
an interposer, wherein the first radiator and the first feeding path are disposed in the interposer; and
a first metal piece configured to connect the first radiator and a second radiator, wherein the second radiator is disposed in a printed circuit board (PCB), wherein the first radiator and the second radiator form at least a part of an end-fire antenna.

16. The apparatus of claim 15, wherein the apparatus further comprises a second metal piece configured to connect the first feeding path and a second feeding path, wherein the second feeding path is disposed in the PCB, and wherein the second feeding path is configured to feed the second radiator.

17. The apparatus of claim 15, wherein the first radiator comprises a first ground plate, wherein the second radiator comprises a second ground plate, and wherein the first ground plate and the second ground plate are connected by the first metal piece.

18. The apparatus of claim 15, wherein the first radiator comprises a first main radiation plate, wherein the second radiator comprises a second main radiation plate, and wherein the first main radiation plate and the second main radiation plate are connected by the first metal piece.

19. The apparatus of claim 15, wherein the first radiator comprises a first parasitic radiator, wherein the second radiator comprises a second parasitic radiator, and wherein the first parasitic radiator and the second parasitic radiator are connected by the first metal piece.

20. The apparatus of claim 18, wherein the first main radiation plate comprises a first positive-polarized element and a first negative-polarized element that are perpendicular to each other, and wherein the second main radiation plate comprises a second positive-polarized element and a second negative-polarized element that are perpendicular to each other.

* * * * *